(12) United States Patent
Dunn et al.

(10) Patent No.: US 6,463,570 B1
(45) Date of Patent: Oct. 8, 2002

(54) APPARATUS AND METHOD FOR VERIFYING PROCESS INTEGRITY

(75) Inventors: Michael J. Dunn; Mark Brandon Fuselier, both of Austin, TX (US)

(73) Assignee: Advanced Micro Devices, Austin, TX (US)

( * ) Notice: Subject to any disclaimer, the term of this patent is extended or adjusted under 35 U.S.C. 154(b) by 0 days.

(21) Appl. No.: 09/625,620

(22) Filed: Jul. 26, 2000

(51) Int. Cl.[7] .............................................. G06F 17/50
(52) U.S. Cl. ................................................. 716/4; 716/5
(58) Field of Search ........................ 324/763; 375/354; 331/57, 34, 1 A; 702/132; 368/113; 716/1–10, 18; 327/114, 243

(56) References Cited

U.S. PATENT DOCUMENTS

| | | | | |
|---|---|---|---|---|
| 5,045,811 A | * | 9/1991 | Lewis ......................... 331/1 A |
| 5,095,267 A | * | 3/1992 | Merrill et al. ................. 257/48 |
| 5,204,559 A | * | 4/1993 | Deyhimy et al. ........... 327/114 |
| 5,373,535 A | * | 12/1994 | Ellis et al. ................... 375/354 |
| 5,440,592 A | * | 8/1995 | Ellis et al. ................... 375/354 |
| 5,459,766 A | * | 10/1995 | Huizer et al. ............... 375/373 |
| 5,606,292 A | * | 2/1997 | Oh ................................ 331/57 |
| 5,796,313 A | * | 8/1998 | Eitan ........................... 326/27 |
| 5,811,983 A | * | 9/1998 | Lundberg ................... 324/763 |
| 5,854,576 A | * | 12/1998 | Swan .......................... 331/57 |
| 5,923,676 A | * | 7/1999 | Sunter et al. ............... 714/733 |
| 5,940,725 A | * | 8/1999 | Hunter et al. ............... 438/229 |
| 5,956,289 A | * | 9/1999 | Norman et al. ........ 365/185.23 |
| 6,047,248 A | * | 4/2000 | Georgiou et al. ........... 702/132 |
| 6,069,849 A | * | 5/2000 | Kingsley et al. ............ 368/113 |
| 6,087,234 A | * | 7/2000 | Wu ............................. 438/299 |
| 6,121,810 A | * | 9/2000 | Philpott ...................... 327/243 |
| 6,160,755 A | * | 12/2000 | Norman et al. ............. 365/194 |
| 6,204,694 B1 | * | 3/2001 | Sunter et al. ................. 326/93 |
| 6,211,727 B1 | * | 4/2001 | Carobolante ................ 323/282 |
| 6,229,402 B1 | * | 5/2001 | Katoaka et al. ............... 331/34 |
| 6,300,785 B1 | * | 10/2001 | Cook et al. ................. 324/765 |

* cited by examiner

*Primary Examiner*—Matthew Smith
*Assistant Examiner*—Paul Dinh
(74) *Attorney, Agent, or Firm*—Barry S. Newberger; Winstead Sechrest & Minnick P.C.

(57) ABSTRACT

An apparatus and method for verifying a process step in the fabrication of an integrated circuit device is implemented. A ring oscillator is fabricated on the dice constituting the integrated circuit device being manufactured. The ring oscillator structure is adapted for sensitizing the ring oscillator to variations in the process step being verified. During test of the wafer containing the dice, a scan of the frequency of the ring oscillator across the wafer for each die under test is made. Deviations in the ring oscillator frequency from a preselected nominal value delimit regions of the wafer for which the process step is marginal.

21 Claims, 5 Drawing Sheets

APPARATUS AND METHOD FOR VERIFYING PROCESS INTEGRITY

TECHNICAL FIELD

The present invention relates in general to the fabrication of integrated circuit devices, and in particular to the verifying fabrication of salicide layers and other structural features in an integrated circuit device.

BACKGROUND INFORMATION

Metal oxide semiconductor transistors used in modem integrated circuit devices typically employ polysilicon gate electrodes. The conductivity of the polysilicon is increased by the formation of a metal salicide layer on the polysilicon. Typically, titanium (Ti) is used, forming a $TiSi_2$ salicide layer although other methods, for example, cobalt (Co) may also be used. (The deposition of the layer is typically done using a self-aligned salicidation process, and the resulting layer is typically referred to as a salicide layer or simply the salicide.)

Poor salicide formation during fabrication leads to reduced performance of the integrated circuit device. This may be particularly acute over the shallow trench isolation (STI) step. The STI step isolates the complementary active elements in the complementary metal oxide semiconductor (CMOS) devices. Poor salicide formation over the STI step can lead to short but high resistance paths. Furthermore, the formation of salicide can vary across the surface of the wafer whereby the formation of marginal salicide may be restricted to only a portion of the wafer surface. Existing test processes are not sensitive to this coverage variability. These typically employ a polysilicon serpentine deposited on a portion of the wafer between dies and measuring the resistance of the polysilicon. Consequently, there is a need in the art for apparatus and methods to characterize salicide layers in CMOS integrated circuit devices, and in particular methods and apparatus which permit characterization at the die level.

SUMMARY OF THE INVENTION

The aforementioned needs are addressed by the present invention. Accordingly there is provided, in a first form, a process step verification method. The method includes providing a ring oscillator on each die being verified, the ring oscillator having a structure adapted for sensitizing the ring oscillator to a predetermined process step. A period of the ring oscillator for the die under test is measured and compared with a preselected specification.

There is also provided, in a second form, a data processing system for process step verification. The system includes circuitry operable for measuring a period of a ring oscillator for a die under test, in which the ring oscillator is provided on each die being verified. Each ring oscillator has a structure adapted for sensitizing the ring oscillator to a predetermined process step. The system also contains circuitry operable for comparing the period with a preselected specification.

Additionally there is provided, in a third form, a computer program product embodied in a storage medium. The program product for process step verification constitutes a program of instructions for performing the steps of a method which includes measuring a period of a ring oscillator for a die under test, in which the ring oscillator is provided on each die being verified. The ring oscillator has a structure adapted for sensitizing the ring oscillator to a predetermined process step. The method also includes comparing the period with a preselected specification.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
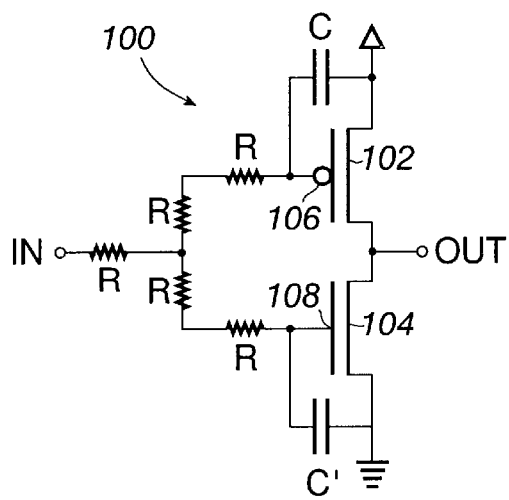
FIGS. 1A, 1B and 1C illustrate an inverter circuit that may be used with the present invention.

A ring oscillator is fabricated on each die constituting the integrated device being manufactured. As is well known in the art, the dice are formed on a wafer of semiconductor material, typically silicon, each wafer containing a plurality of integrated circuit dice. During wafer test, a scan of the frequency of the ring oscillator for each die under test is made across the wafer. Deviations in the ring oscillator frequency from a preselected nominal value delimit regions of the wafer in which the salicidation or other process step is marginal.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Refer now to FIG. 1A illustrating inverter 100 which may be used in the present invention the principles of which are described further below. Inverter 100 includes p-type metal oxide semiconductor field effect transistor (PFET) 102 and n-type metal oxide semiconductor field effect transistor (NFET) 104. The common drains of PFET 102 and NFET 104 form the output of inverter 100. Between the input to the inverter and the gates, 106 and 108, of PFET 102 and NFET 104, respectively, are parasitic resistances arising in the underlying resistivity of the polysilicon forming the input electrodes and gate contacts of the devices and the interconnections there between. These parasitic resistances, which are distributed resistances, are schematically indicated in FIG. 1A by the lumped elements, R. Additionally, parasitic capacitances couple the gate electrodes, 106 and 108, to the supply rails. These are shown in FIG. 1A as capacitances C' and C". Other sources of parasitic capacitance may also occur in the fabrication of an integrated circuit device, and may also be exploited to verify process integrity at the die level as will be discussed further below in conjunction with an alternative embodiment of the present invention. When verifying salicide formation in accordance with the principles of the present invention, the propagation delay through inverter 100 may principally be determined by the time constants of the RC network formed by the distributed resistances, R and the capacitances C' and C".

Figure 1B:
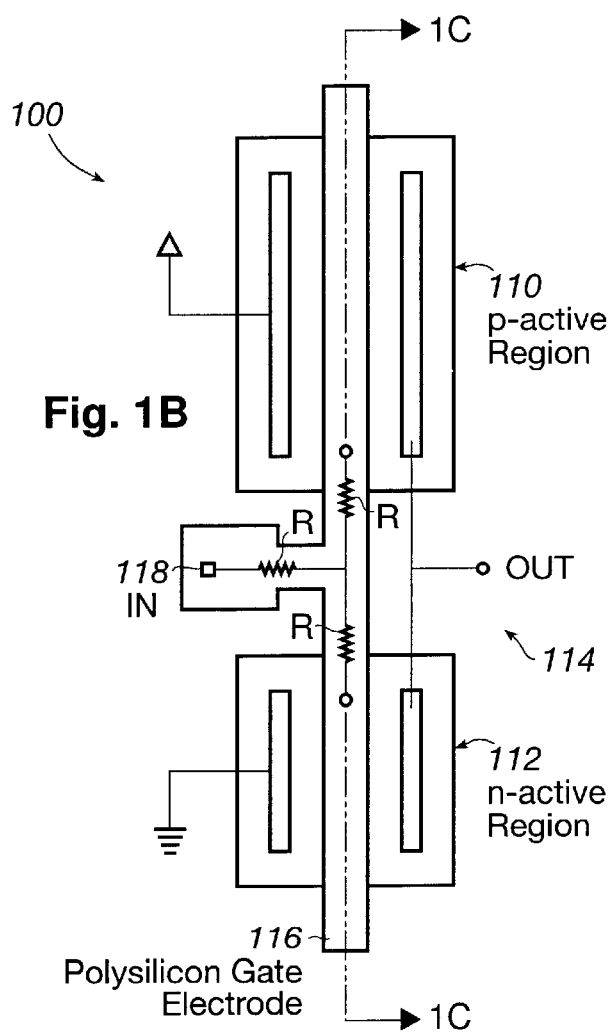

Inverter 100, and the nature of the parasitic elements therein, may be further understood by referring now to FIG. 1B illustrating in simplified form, a plan view of an inverter structure corresponding to the inverter of FIG. 1A. A p-active region 110, corresponding to PFET 102, FIG. 1A, and an n-active region 112, corresponding to NFET 104 are separated by a shallowed trench isolation (STI) region 114. A polysilicon gate interconnect electrode 116 forms the common gate electrode of inverter 100, and bears input pad 118. Polysilicon gate electrode 116 incorporates a salicide layer (not shown in FIG. 1B) to provide a low-resistivity gate electrode. Lumped resistors, R are overlaid on the structure in FIG. 1B to serve as a mnemonic device representing the parasitic, distributed resistance associated with the polysilicon gate electrode 116, and particularly the salicide layer formed thereon. For simplicity, the capacitors C' and C" of FIG. 1A are not shown in FIG. 1B.

Figure 1C:
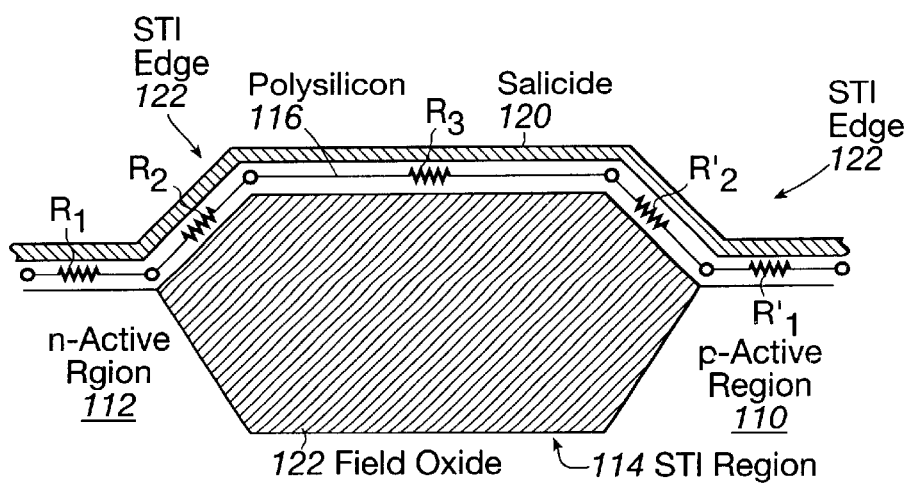

Refer now to FIG. 1C illustrating, in simplified form, a cross-sectional view through the inverter structure in FIG. 1B. In FIG. 1C is depicted salicide layer 120 on polysilicon electrode 116. Field oxide 122 is deposited within STI region 114 and isolates the active regions of the inverter. Polysilicon electrode 116 spans field oxide 122. Again, for illustrative purposes, lumped resistors $R_1$, $R'_1$, $R_2$, $R'_2$, and $R_3$ are overlaid on the structure in FIG. 1C as a mnemonic device representing the distributed resistances associated with the salicide layer 120 over active regions 110 and 112, STI edges 122, and STI region 114, respectively. The resistances associated with the salicide layer 120 are affected by the quality of the formation of the layer, and a marginal fabrication step may give rise to an enhanced resistance being contributed by the corresponding portion of salicide layer 120. For example, if the portion of the salicide layer 120 over one or both of the STI edges 122 is thinned, the corresponding resistances, $R_2$ and $R_2'$ may be increased over the nominal value of these resistances.

Such imperfections in the salicide layer 120 can degrade performance of the integrated circuit device being fabricated. Moreover, process variations giving rise to marginal layer formation may be localized over portions of the wafer being manufactured. As previously discussed, present methods for verifying polysilicon integrity may be insensitive to these effects.

Figure 2A:
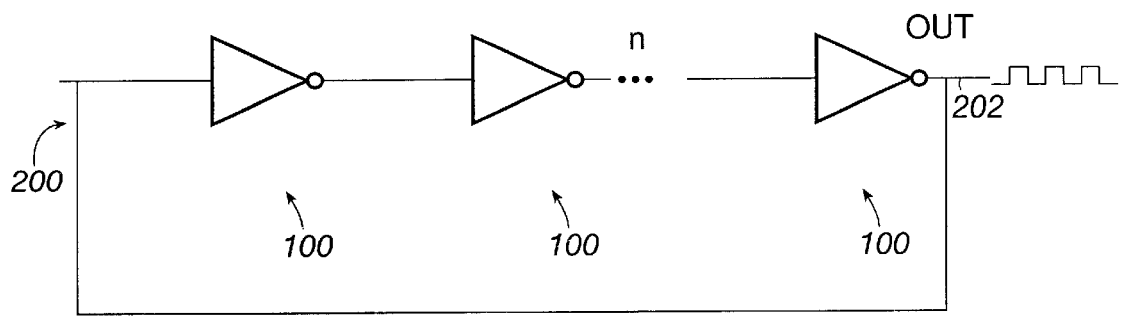
FIG. 2 illustrates, in partial schematic form, a ring oscillator which may be used in an embodiment of the a present invention.
FIG. 2B illustrates, in partial schematic form, a ring oscillator which may be used in another embodiment of the present invention.
FIG. 2C illustrates, in partial schematic form, a ring oscillator which may be used in an additional embodiment of the present invention.

Localized imperfections in the salicide layer, such as layer 120 in FIG. 1C, may be detected by providing on each die, a ring oscillator formed from inverter elements 100. Such a ring oscillator 200 is illustrated in FIG. 2A. Ring oscillator 200 includes an odd number, n, of inverters 100. Output 202 of ring oscillator 200 constitutes an oscillatory signal having a period determined by the propagation delays through the n inverters 100. In turn, the propagation delays are determined by the RC time constant of the parasitic resistance and capacitance network of the corresponding inverter 100, as discussed in conjunction with FIG. 1A. In particular, in implementing a ring oscillator sensitive to the salicidation step, the interconnect between inverters 100 in FIG. 2A may be fabricated from salicide bearing polysilicon in which the interconnect has a preselected length. The length of the polysilicon interconnect is selected such that the variation in ring oscillator frequency due to variations in the RC time constants of the parasitic elements is swamped by variations in the polysilicon resistance. Thus, a ring oscillator formed from inverters having imperfections in the formation of the salicide layer such that the salicide layer is thinned over a portion of the inverter structure, for example, will exhibit an output signal having a period that is increased over the period of a ring oscillator formed from inverters having the nominal salicide layer. Thus, by measuring the oscillation period, or equivalent, frequency, of the output of the ring oscillator, a device having a marginal salicidation may be detected. Additionally, in an alternative embodiment in accordance with the present invention, the printing of the polysilicon lines themselves, in vertical or horizontal configurations, may be verified by fabricating the ring oscillator with vertically or horizontally drawn inverters, respectively. Furthermore, by scanning the period measurement across the wafer for each die, localized regions of marginal salicidation may be ascertained.

Additionally, other process variations giving rise to marginal devices may be determined in similar fashion. In general, an integrated circuit element may have other sources of parasitic resistance and capacitance in addition to those discussed in conjunction with FIGS. 1A–C. These may include, for example, source/drain diffusion resistance and junction capacitance, metal interconnect resistances and contact resistance in vias. Process variations can also give rise to localized regions on a wafer having degraded performance because the process variation results in the enhancement of a parasitic element. For example, thinning of an oxide insulating layer may give rise to an increase in the capacitance between conducting elements separated by the oxide layer with a concomitant degradation in the performance of the associated integrated circuit device. Other examples include gate oxide thickness variation, increased contact resistance due to poor cleans between layers, or pattern deformation, and enhanced capacitance due to reduced interconnect spacing. Such parasitic elements form RC networks that load the outputs of active devices in the integrated circuit, and a plurality of inverters forming a ring oscillator will experience additional propagation delays due to these parasitic networks as well.

Figure 2B:
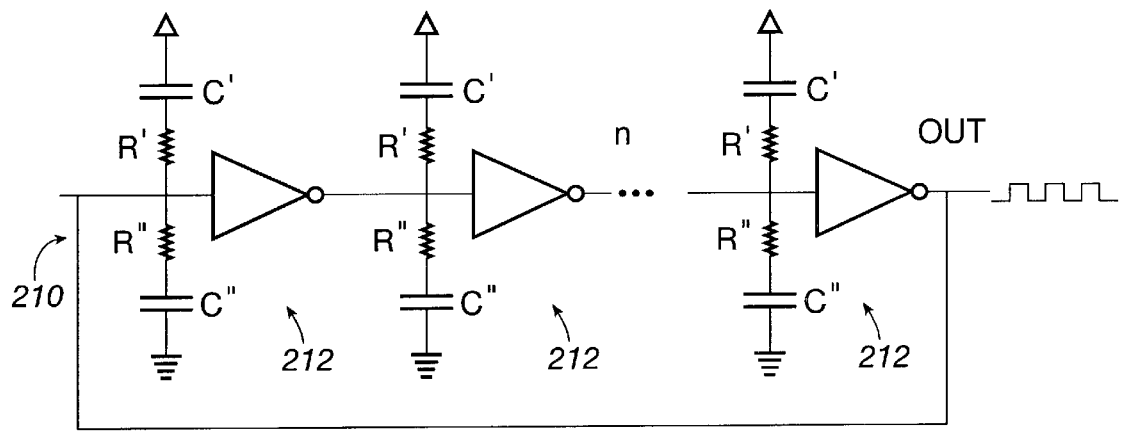
Figure 2C:
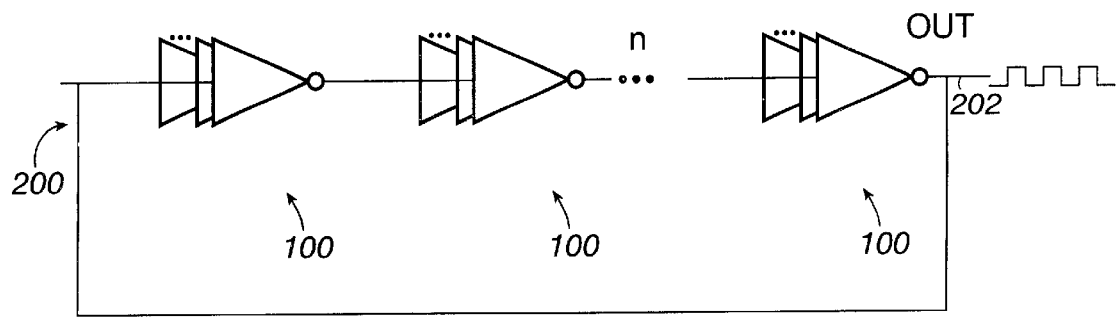

Such a ring oscillator is illustrated in FIG. 2B. Each inverter 212 is loaded by networks R'C' and R"C" which are between the corresponding inverter output and the supply rails. In general, the propagation delays due to the aforesaid RC networks contribute propagation delays in addition to the parasitic elements within inverters 212 analogous to those discussed hereinabove in conjunction with FIGS. 1A–1C. However, the principles of the present invention may also be applied to determine process variations associated with the RC networks in FIG. 2B. In such an embodiment, a ring oscillator 210 is provided on each die on the wafer as previously described. The design of the inverter elements constituting the ring oscillator is selected such that the delays introduced by the parasitic elements associated with the inverter structure itself are rendered sufficiently small relative to the delays arising from the networks R'C" and R"C". For example, an inverter structure may be fabricated on the die with shorter polysilicon interconnects, whereby the propagation delays associated with the distributed resistance of a polysilicon are small compared to the delays introduced by the networks as depicted in FIG. 2B. Design features of the ring oscillator stages may then be selected to sensitize the ring oscillator to process steps of interest. Embodiments sensitive to contact resistance, fan out, gate versus junction capacitance, metallization capacitance may be implemented. Similar to the sensitivity to salicide formation discussed above, the inverters may be coupled together using a contact chain formed by interlinking a string of contacts to provide a ring oscillator on each die sensitive to contact resistance to verify the process steps used in contact fabrication. In an alternative embodiment, device timing sensitivity to fan out may be verified by fabricating a ring oscillator as in FIG. 2A in which each of the n stages includes a plurality of inverters having inputs connected in parallel and having the parallel inputs coupled to the output of one of the inverters of the plurality of the preceding stage, as shown in FIG. 2C. Another alternative embodiment, for verifying the gate versus junction capacitance effects may be implemented via a ring oscillator formed from cascaded gate elements having a transistor stack forming the input path. By fabricating the ring oscillator with the stages cascaded through the top transistor in the stack (with the other gate inputs tied to a supply rail as appropriate to form an inverter) and again with the stages cascaded through the bottom transistor in the stack, the sensitivity of device speed to gate versus junction capacitance may be verified. Referring again to FIG. 2B, the parasitic capacitances C' and C", may be dominated by the capacitance between metallization by tying the metal to the inverter outputs, in yet another embodiment of a ring oscillator in accordance with the principles of the present invention. Typically in the fabrication of an integrated circuit device, there are multiple metal levels, and the intermetal capacitances C' and C" may, alternatively, be implemented in the ring oscillator as line-to-line capacitances (i.e., the same level) or top-to-bottom (i.e. different level) metallization capacitance, depending on the process step to be verified. By scanning across the wafer and determining the periods of the ring oscillators, regions of the wafer having marginal device performance may be identified.

Figure 3A:
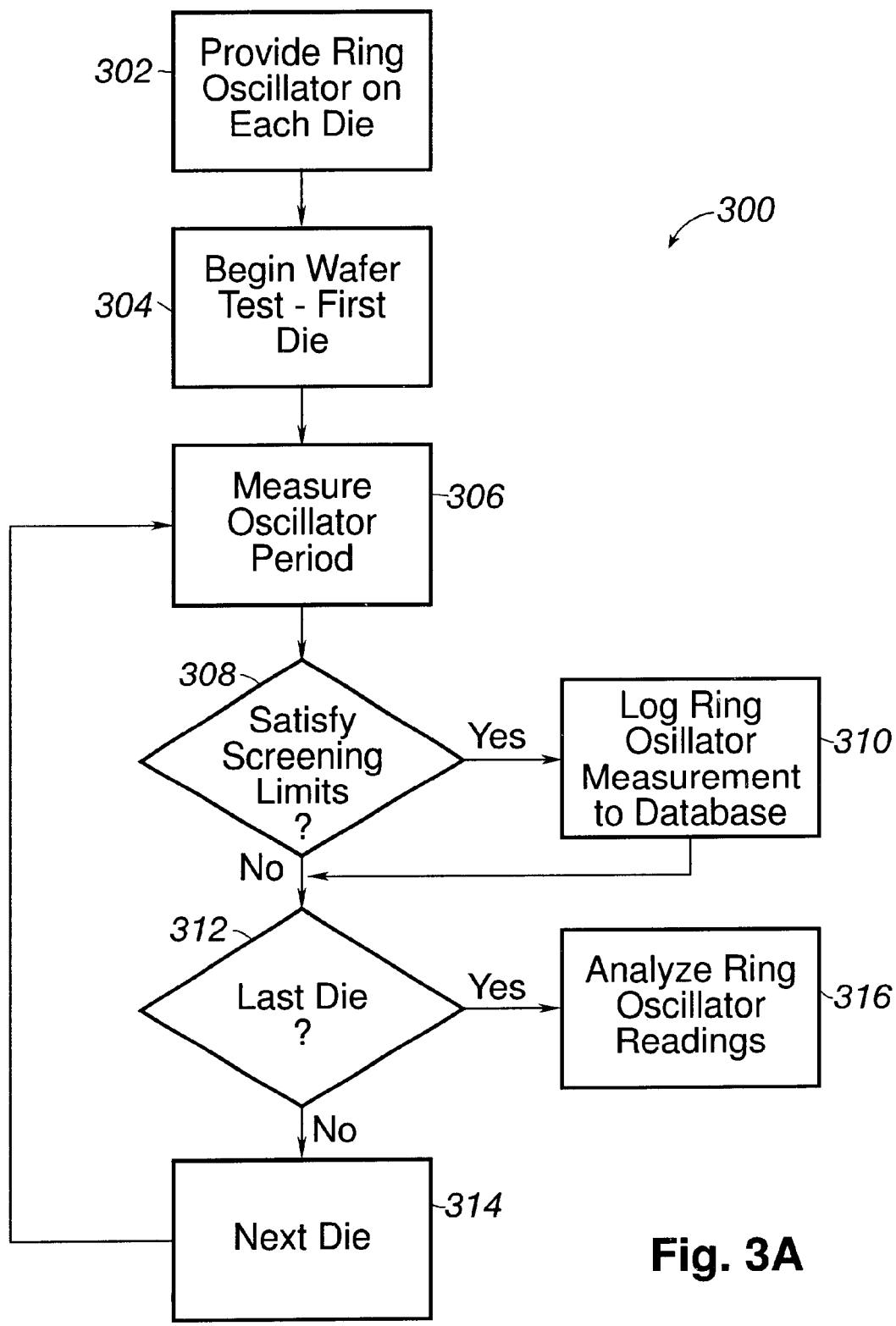
FIGS. 3A and 3B illustrate, in flow chart form, a verification methodology in accordance with an embodiment of the present invention.

The principles of the present invention may be further understood by referring now to FIG. 3A, illustrating in flow chart form, a portion of verification process 300 in accordance with the present invention. In step 302, a ring oscillator is provided on each die of the wafer being fabricated. The structure of the inverters constituting each ring oscillator is implemented in accordance with a predetermined set of parameters which are selected to sensitize the ring oscillator to variations in the fabrication process steps being verified. In step 304, testing of the wafer begins with a first die. The period of the ring oscillator on the current die is measured in step 306, and in step 308 is determined if the ring oscillator measurement is within preselected screening limits. These limits are chosen to eliminate ring oscillators that have failed completely, or are otherwise unrelated to the process of interest. For example, limits of 10 KHz–1000 MHz may be set for a ring oscillator reading that oscillates, at normal process conditions, at 10 MHz. If, the current die is within the screening limits, in step 310 the ring oscillator measurement is logged to a database. The die may be identified and logged based on its position on the wafer. The position may be specified in terms of a artesian (x,y) coordinate system defined for the wafer. Additionally, each wafer is identified by a serial number which may also be associated with the log being generated.

If, the die under test falls outside of the screening limits, step 310 is bypassed, and in step 312 it is determined if the current die under test is the last die to be tested. If not, in step 314 the process proceeds to the next die and loops back to step 306. The process then loops over steps 306–312 until all dice have been tested, and then, step 312 proceeds by the "Yes" branch to step 316. In step 316, the ring oscillator data logged in step are analyzed.

Figure 3B:
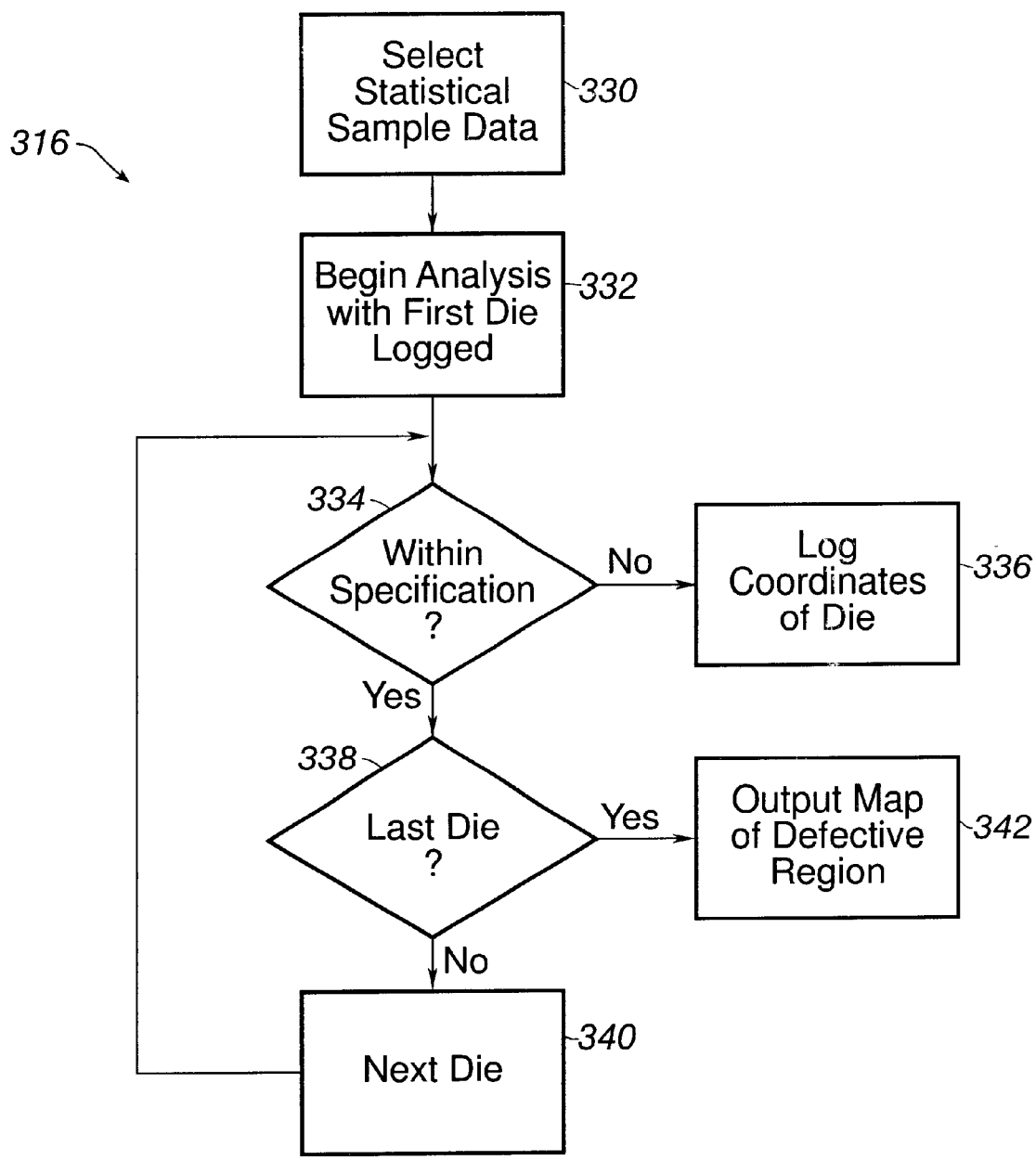

Refer now FIG. 3B, illustrating, in flow chart form, analysis step 316, in further detail. In step 330, a statistical sample of the ring oscillator measurement data is selected. A statistical sample provides a reference datum against which the ring oscillator measurements, in particular the ring oscillator periods, or equivalently frequencies, determined in step 306, above may be used below to verify the fabrication step under test, as discussed below. A statistical sample of a ring oscillator measurements may be taken across a sample size that spans a single wafer, or, alternatively, a wafer lot (typically twenty-five wafers) or a collection of lots. The size of the sample depends on the effect of interest. For example, lot or collection of lot sized samples may typically be used when examining overall yield trends, whereas wafer size samples may typically be used when considering process dependent signals, as in the present invention. The statistical sample will provide a set of measured oscillator periods having a distribution of measured periods, or, equivalently, frequencies. The measured frequencies will have a set of statistical properties, such as a mean frequency, or equivalently period, and a width of the statistical distribution of frequencies about the mean. The width of the distribution is typically expressed in terms of the standard deviation.

In step 332, the analysis begins with the first die logged. In step 334, it is determined if the measured frequency falls within a selected specification, which specification may be in terms of the statistical properties selected in step 330. For example, in step 334 it may be determined if the frequency of the ring oscillator on the die being analyzed is within a standard deviation of the mean frequency of the statistical sample. Alternatively, specification may be defined in terms of a multiple of the standard deviation, or of a first and third quartile limit, and yet another alternative embodiment, a ten percent (10%)/ninety percent (90%) limit. (These latter two are specific measures that are generally referred to in the statistics art as quantiles.) As would be recognized by an artisan of ordinary skill, the principles of the present invention apply independently of the particular statistical measure selected.

If, in step 334 the frequency of the ring oscillator on the die under test is outside of the selected specification, then the coordinates of the die are logged to the database in step 336, or otherwise recorded. If however, the ring oscillator frequency on the die under test is within specification, in step 338 it is determined if the current die is the last die logged into the database. If not, the methodology of the present invention proceeds to the next die in step 340, and then loops over the remaining dice logged into the database in step 310, FIG. 3A. Note that in an alternative embodiment, all dice on a wafer may be logged, and the preliminary screening for failed ring oscillators performed in the analysis step 316. An artisan of ordinary skill would appreciate that such an alternative embodiment would be within the spirit and scope of the present invention. If however, in step 338, all the logged dice have been screened, in step 342 a map of the defective region on the corresponding wafer is output, which map maybe generated from the x-y coordinates of the dice logged in step 336. In this way, a fabrication process step being verified that is marginal over a localized region of the wafer may be identified. Additionally, those dice that are out of specification, and which would have reduced performance may be culled without sacrificing the entire wafer.

Figure 4:
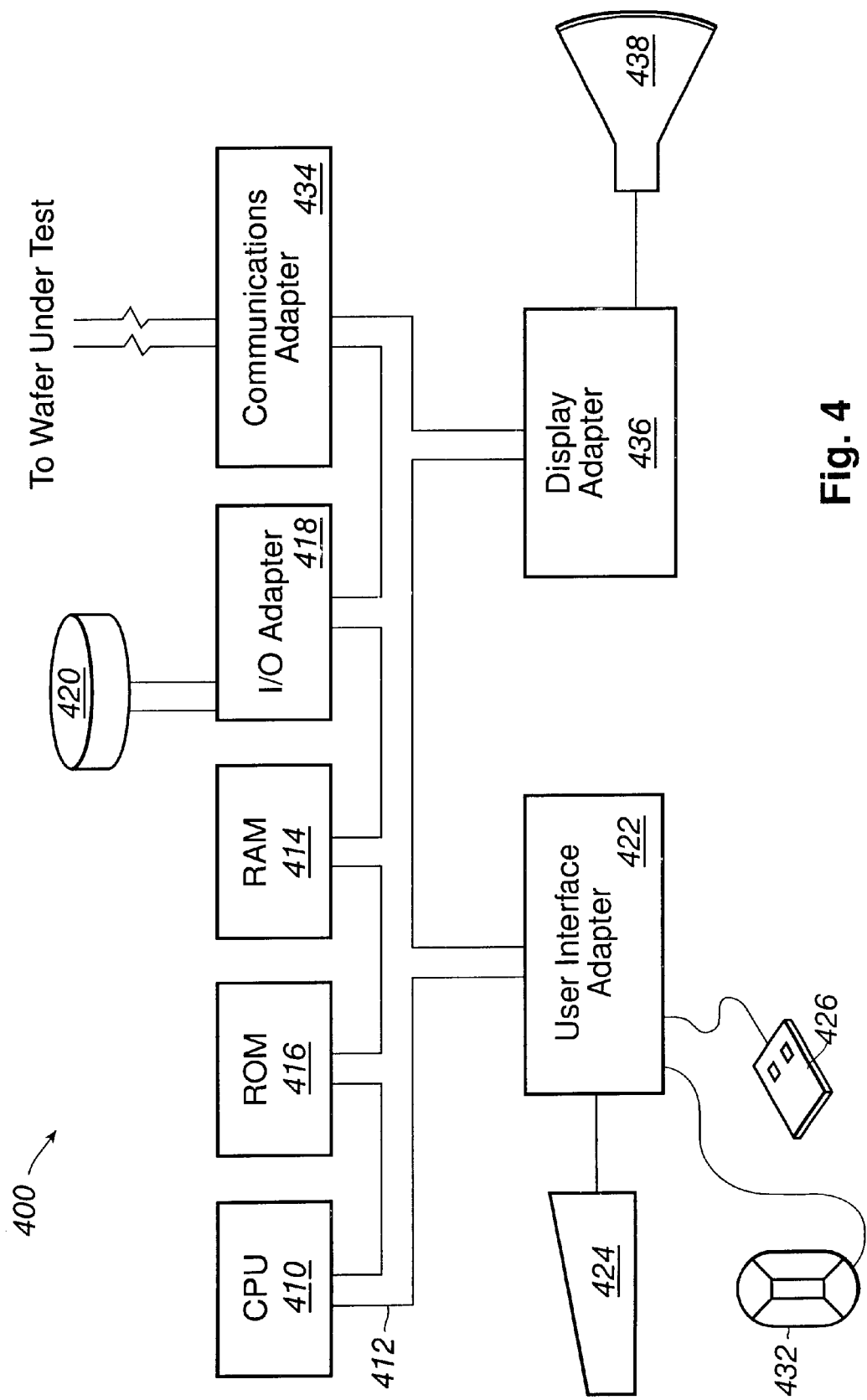
FIG. 4 illustrates, in block diagram form a data processing system implemented in accordance with an embodiment of the present invention.

The method of the present invention may be performed by a data processing system coupled to the wafer under test. In FIG. 4, an example is shown of a data processing system 400 which may be used for the invention. The system has a central processing unit (CPU) 410, which is coupled to various other components by system bus 412. Read only memory ("ROM") 416 is coupled to the system bus 412 and includes a basic input/output system ("BIOS") that controls certain basic functions of the data processing system 100. Random access memory ("RAM") 414, I/O adapter 418, and communications adapter 434 are also coupled to the system bus 412. I/O adapter 418 may be a small computer system interface ("SCSI") adapter that communicates with a disk storage device 420. Communications adapter 434 interconnects bus 412 with the wafer under test. Input/Output devices are also connected to system bus 412 via user interface adapter 422 and display adapter 436. Keyboard 424, track ball 432 and mouse 426 are all interconnected to bus 412 via user interface adapter 422. Display monitor 438 is connected to system bus 412 by display adapter 436. In this manner, a user is capable of inputting to the system throughout the keyboard 424, trackball 432 or mouse 426 and receiving output from the system via display 438.

Preferred implementations of the invention include implementations as a computer system programmed to execute the method or methods described herein, and as a computer program product. According to the computer system implementation, sets of instructions for executing the method or methods are resident in the random access memory 414 of one or more computer systems configured generally as described above. Until required by the computer system, the set of instructions may be stored as a computer program product in another computer memory, for example, in disk drive 420 (which may include a removable memory such as an optical disk or floppy disk for eventual use in the disk drive 420). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical, biological, or some other physical change. While it is convenient to describe the invention in terms of instructions, symbols, characters, or the like, the reader should remember that all of these and similar terms should be associated with the appropriate physical elements.

Note that the invention may describe terms such as comparing, validating, selecting, identifying, or other terms that could be associated with a human operator. However, for at least a number of the operations described herein which form part of at least one of the embodiments, no action by a human operator is desirable. The operations described are, in large part, machine operations processing electrical signals to generate other electrical signals.

Although the present invention and its advantages have been described in detail, it should be understood that various changes, substitutions and alterations can be made herein without departing from the spirit and scope of the invention as defined by the appended claims.

What is claimed is:

1. A process step verification method comprising the steps of:
   providing a ring oscillator on each die being verified, said ring oscillator having a structure adapted for sensitizing said ring oscillator to a predetermined process step;
   measuring a period of said ring oscillator for the die under test; and
   comparing said period with a preselected specification.

2. The method of claim 1 wherein said step of comparing said period comprises the steps of:
   determining a difference between said period of said ring oscillator and a preselected nominal value; and
   comparing said difference with a preselected deviation specification.

3. The method of claim 1 further comprising the steps of:
   identifying each die in which said period is outside said preselected specification; and
   mapping each such die to a corresponding physical location on a wafer, whereby one or more portions of said wafer having a marginal performance characteristic are identified.

4. The method of claim 1 wherein said ring oscillator structure includes a plurality of cascaded inverters, each inverter of said plurality having an output coupled to an input of a next inverter by a polysilicon interconnect having a preselected length.

5. The method of claim 4 wherein said process step comprises a salicidation step.

6. The method of 4 wherein said ring oscillator is sensitive to a variation in a distributed resistance of the polysilicon interconnects.

7. The method of claim 3 further comprising the step of logging said period of said ring oscillator to a database, and wherein said step of identifying said die includes logging a position of said die to said database in association with said period.

8. A data processing system for process step verification comprising:
   circuitry operable for measuring a period of a ring oscillator for a die under test, wherein said ring oscillator is provided on each die being verified, said ring oscillator having a structure adapted for sensitizing said ring oscillator to a predetermined process step; and
   circuitry operable for comparing said period with a preselected specification.

9. The system of claim 8 wherein said circuitry operable for comparing said period comprises:
   circuitry operable for determining a difference between said period of said ring oscillator and a preselected nominal value; and
   circuitry operable for comparing said difference with a preselected deviation specification.

10. The system of claim 8 further comprising:
    circuitry operable for identifying each die wherein said period is outside said preselected specification; and
    circuitry operable for mapping each such die to a corresponding physical location on a wafer, whereby one or more portions of said wafer having a marginal performance characteristic are identified.

11. The system of claim 8 wherein said ring oscillator structure includes a plurality of inverters, each inverter of said plurality having an output coupled to an input of a next inverter by a polysilicon interconnect having a preselected length.

12. The system of claim 11 wherein said process step comprises a salicidation step.

13. The system of claim 11 wherein said ring oscillator is sensitive to a variation in a distributed resistance of the polysilicon interconnects.

14. The system of claim 10 further comprising circuitry operable for logging said period of said ring oscillator to a database, and wherein said circuitry operable for identifying said die comprises circuitry operable for logging a position of said die to said database in association with said period.

15. A computer program product embodied in a storage medium, the program product for process step verification including a program of instructions for performing the method steps of:

measuring a period of a ring oscillator for a die under test, wherein said ring oscillator is provided on each die being verified, said ring oscillator having a structure adapted for sensitizing said ring oscillator to a predetermined process step; and comparing said period with a preselected specification.

16. The program product of claim 15 wherein said step of comparing said period comprises:

determining a difference between said period of said ring oscillator and a preselected nominal value; and comparing said difference with a preselected deviation specification.

17. The program product of claim 15 further including instructions for performing the steps of:

identifying each die wherein said period is outside said preselected specification; and mapping each such die to a corresponding physical location on a wafer, whereby one or more portions of said wafer having a marginal performance characteristic are identified.

18. The program product of claim 15 wherein said ring oscillator structure includes a plurality of cascaded inverters, each inverter of said plurality having an output coupled to an input of a next inverter by a polysilicon interconnect having a preselected length.

19. The program product of claim 18 wherein said process step comprises a salicidation step.

20. The program product of claim 18 wherein said ring oscillator is sensitive to a variation in a distributed resistance of the polysilicon interconnects.

21. The program product of claim 17 further comprising a program of instructions for performing the step of logging said period of said ring oscillator to a database, and wherein said instructions for performing the step of identifying said die comprises instructions for performing the step of logging a position of said die to said database in association with said period.

* * * * *